United States Patent
Hahakura et al.

(10) Patent No.: US 7,371,586 B2
(45) Date of Patent: May 13, 2008

(54) SUPERCONDUCTOR AND PROCESS FOR PRODUCING THE SAME

(75) Inventors: Shuji Hahakura, Osaka (JP); Kazuya Ohmatsu, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/536,694

(22) PCT Filed: Aug. 6, 2004

(86) PCT No.: PCT/JP2004/011679

§ 371 (c)(1), (2), (4) Date: May 27, 2005

(87) PCT Pub. No.: WO2005/029512

PCT Pub. Date: Mar. 31, 2005

(65) Prior Publication Data

US 2006/0014304 A1    Jan. 19, 2006

(30) Foreign Application Priority Data

Sep. 17, 2003 (JP) .............................. 2003-324167

(51) Int. Cl.
*H01L 21/00* (2006.01)

(52) U.S. Cl. .................. 438/2; 438/680; 257/E39.001; 257/E39.017; 257/E21.298

(58) Field of Classification Search .............. 438/2, 438/680; 257/E39.001, E39.017, E21.298
See application file for complete search history.

(56) References Cited

U.S. PATENT DOCUMENTS

| | | | | |
|---|---|---|---|---|
| 5,183,800 A | * | 2/1993 | Nakagawa | 505/330 |
| 5,432,151 A | * | 7/1995 | Russo et al. | 505/474 |
| 5,922,651 A | * | 7/1999 | Hoshizaki et al. | 505/473 |
| 6,451,450 B1 | * | 9/2002 | Goyal et al. | 428/629 |
| 6,743,292 B2 | * | 6/2004 | Jia et al. | 117/108 |
| 6,993,823 B2 | * | 2/2006 | Kobayashi et al. | 29/599 |
| 2003/0134749 A1 | * | 7/2003 | Onabe et al. | 505/100 |

FOREIGN PATENT DOCUMENTS

| | | | |
|---|---|---|---|
| EP | 0398164 A2 | * | 11/1990 |
| JP | 01003908 A | * | 1/1989 |

(Continued)

OTHER PUBLICATIONS

Kakimoto et al., "Preparation of Y-system coated conductor with high Ic using repeated deposition by PLD," Abstracts of the 67th Cryogenic Association of Japan (CJS) Conference, Oct. 30-Nov. 1, 2002, p. 228.

(Continued)

*Primary Examiner*—Michelle Estrada
(74) *Attorney, Agent, or Firm*—Foley & Lardner LLP

(57) ABSTRACT

A superconductor and a method for producing the same are provided. The method for producing a superconductor includes the step of forming a superconducting layer on a base layer by performing a film deposition at least three times, wherein the film thickness of a superconducting film in each film deposition is 0.3 μm or less. In such a case, even when the layer thickness of the superconducting layer is increased, the decrease in the Jc is suppressed and the Ic is increased.

10 Claims, 1 Drawing Sheet

FOREIGN PATENT DOCUMENTS

| | | | |
|---|---|---|---|
| JP | 01186657 A | * | 7/1989 |
| JP | 2-120231 A | | 5/1990 |
| JP | 3-53413 A | | 3/1991 |
| JP | 3-75300 A | | 3/1991 |
| JP | 3-115198 A | | 5/1991 |
| JP | 6-72714 A | | 3/1994 |
| JP | 7-206437 A | | 8/1995 |

OTHER PUBLICATIONS

PCT International Preliminary Report on Patentability as issued in International Application No. PCT/JP2004/011679, Mailing date Jun. 29, 2006.

* cited by examiner

SUPERCONDUCTOR AND PROCESS FOR PRODUCING THE SAME

This application is a National Stage application of PCT/JP2004/011679 filed Aug. 6, 2004, which claims priority from Japanese patent application 2003-324167, filed Sep. 17, 2003. The entire contents of each of the aforementioned applications are incorporated herein by reference.

TECHNICAL FIELD

The present invention relates to a superconductor and a method of producing the same, and in particular, to a superconductor having a thick superconducting layer and having a large critical current (hereinafter referred to as "Ic"), and to a method of producing the same.

BACKGROUND ART

With respect to superconductors such as superconducting wires, increasing the thickness of a superconducting layer has been studied in order to increase the critical current.

However, if a superconducting layer is formed so as to have a large thickness by deposition at one time, a sufficient amount of oxygen cannot be taken in the superconducting layer during the film deposition. In such a case, the critical current density (hereinafter referred to as "Jc") is decreased, and accordingly the Ic cannot be increased. Furthermore, if the superconducting layer is formed so as to have a large thickness by performing the film deposition once, the time required for one film deposition process becomes long. As a result, an element, such as Ni, in a base layer is diffused into the superconducting layer, resulting in a problem such as reaction with the superconducting layer.

Therefore, in order to form a thick superconducting layer and to increase the Ic, a multi-layer deposition method has been studied, in which the film deposition is performed at least two times and the thickness of a superconducting film in each film deposition is decreased (For example, see Kazutomi Kakimoto and two others, "Preparation of Y-system coated conductor with high Ic using repeated deposition by PLD", Abstracts of the 67th Cryogenic Association of Japan (CSJ) Conference in 2002, p. 228).

According to Kakimoto et al., the thickness of the superconducting film was controlled to be 0.35 μm in each film deposition and the deposition was performed 4 to 6 times. Even when the thickness of the superconducting layer (10 mm in width) was 1 μm or more, the Ic was as small as about 130 A. In the experiment described in the above-mentioned paper, the moving speed of a base tape having a width of 10 mm on which the superconducting layer was formed was 4 m/h.

Accordingly, it is desired that further increase in the Ic of superconductors be achieved.

DISCLOSURE OF INVENTION

In view of the above-mentioned situation, it is an object of the present invention to provide a superconductor formed by a multi-layer deposition method, in which the Ic is increased with less decrease in the Jc even in the case the thickness of a superconducting layer is increased, and to provide a method for producing such a superconductor.

In order to achieve the above object, according to the present invention, a method for producing a superconductor includes the step of forming a superconducting layer on a base layer by performing a film deposition at least three times, wherein the film thickness of a superconducting film in each film deposition is 0.3 μm or less and the superconducting film having the film thickness of 0.75 to 3 μm is formed on the base layer. Furthermore, in a method of producing a superconductor according to the present invention, the supply area velocity of the base layer in each film deposition may be at least 0.04 $m^2/h$.

A superconductor according to the present invention includes a base layer and a superconducting layer having a layer thickness of 0.75 to 3.0 μm, the superconducting layer being formed by performing a film deposition on the base layer at least three times, wherein the film thickness of a superconducting film in each film deposition is 0.3 μm or less.

BEST MODE FOR CARRYING OUT THE INVENTION

Figure 1:
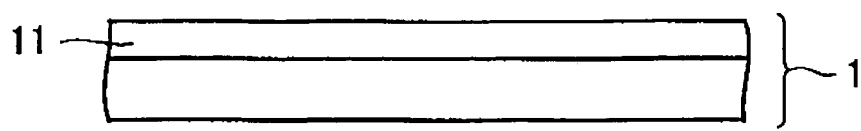
FIGS. 1(a) to 1(d) are views showing a method for producing a superconductor according to the present invention.
Figure 1:
Figure 1:
Figure 1:
Figure 1:
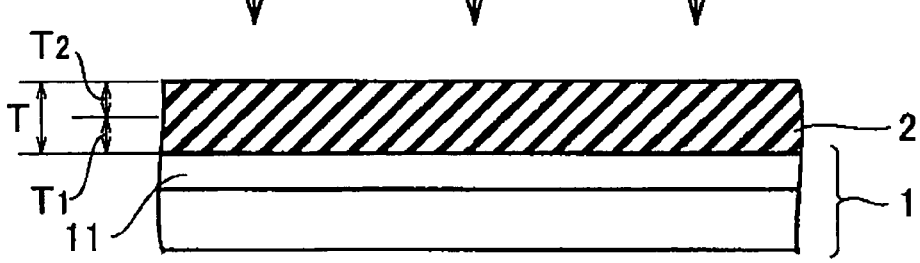
Figure 1:
Figure 1:
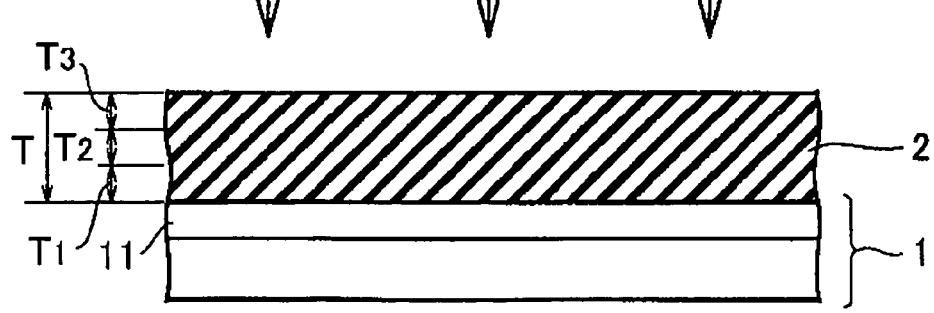

Embodiments of the present invention will now be described. The ratios of the dimensions in the drawings do not always correspond to those in the following description.

According to a method for producing a superconductor of the present invention, referring to FIGS. 1(a) to 1(d), a superconducting layer 2 is formed on a base layer 1 by performing a film deposition at least two times to produce a superconductor 100, wherein the film thickness of a superconducting film in each film deposition is 0.3 μm or less and the superconducting film having the film thickness of 0.75 to 3 μm is formed on the base layer.

For example, a method in which the film deposition is performed three times will now be described with reference to FIGS. 1(a) to 1(d). Firstly, the base layer 1 shown in FIG. 1(a) is prepared. As shown in FIG. 1(b), a first film deposition 21 is performed on the base layer 1 such that the film thickness $T_1$ of the superconducting film formed by the first film deposition is 0.3 μm or less to form the superconducting layer 2.

Subsequently, as shown in FIG. 1(c), a second film deposition 22 is performed on the superconducting layer 2 formed as described above such that the film thickness $T_2$ of the superconducting film formed by the second film deposition is 0.3 μm or less to increase the layer thickness T of the superconducting layer 2. At this point, the layer thickness T of the superconducting layer 2 is represented by $T=T_1+T_2$. Subsequently, a third film deposition 23 is performed on the superconducting layer 2 formed as described above such that the film thickness $T_3$ of the superconducting film formed by the third film deposition is 0.3 μm or less to further increase the layer thickness T of the superconducting layer 2. At this point, the layer thickness T of the superconducting layer 2 is represented by $T=T_1+T_2+T_3$.

Thus, the film deposition is sequentially repeated to increase the layer thickness of the superconducting layer. After the film deposition is performed n times, the layer thickness T of the superconducting layer is generally represented by $T=T_1+T_2+\ldots+T_n$ wherein n represents an integer of three or more.

In the second and the following film deposition, when a superconducting film having the same chemical composition as that in the first film deposition is deposited, there is no difference between the superconducting films in each film deposition. In such a case, one superconducting layer is formed even after the film deposition is performed n times.

In the method for producing a superconductor according to the present invention, the thickness of the superconducting film in each film deposition is 0.3 μm or less. When the film thickness exceeds 0.3 μm, it is difficult to cause the superconducting layer to take a sufficient amount of oxygen thereinto during the film deposition, and accordingly the Jc of the superconducting layer decreases. In such a case, even when the thickness of the superconducting layer is increased, it is difficult to increase the Ic of the superconducting layer.

In FIGS. 1(a) to 1(d), the material of the superconducting layer 2 is not particularly limited. Preferable examples include oxide superconducting materials such as $RE_1Ba_2Cu_3O_{7-\delta}$ (wherein RE represents a rare earth element and hereinafter represents the same). The method for forming the superconducting layer 2, in other words, the method for depositing the superconducting film is not particularly limited so long as the film deposition can be performed in an oxygen atmosphere. Examples of the vapor deposition preferably include a pulsed laser deposition, an electron-beam deposition method, and a sputtering method. Examples of the liquid-phase method preferably include a metal organic deposition (MOD) method, a trifluoroacetic acid metal organic deposition (TFA-MOD) method, and a liquid phase epitaxy (LPE) method.

In FIGS. 1(a) to 1(d), the base layer 1 represents a layer on which the superconducting layer is formed. The base layer 1 may be composed of a substrate or composed of the substrate and a buffer layer disposed thereon. In the former case, the superconductor 100 includes the substrate, which is the base layer 1, and the superconducting layer 2. In the latter case, the superconductor 100 includes the substrate and the buffer layer, which form the base layer 1, and the superconducting layer 2. In the base layer 1, at least a base layer (hereinafter referred to as adjacent base layer 11) adjacent to the superconducting layer must have a biaxial orientation. Accordingly, when the substrate corresponds to the adjacent base layer 11, the substrate must have the biaxial orientation. When the buffer layer is in the position of the adjacent base layer 11, the buffer layer must have the biaxial orientation and the substrate need not have the biaxial orientation. Herein, the words "have a biaxial orientation" means not only the case where the adjacent base layer has a perfect biaxial orientation but also the case where the discrepancy angle of a crystal axis in the adjacent base layer is 25° or less. The two axes in the biaxial orientation indicates the crystal axis perpendicular to the face of the adjacent base layer and a crystal axis parallel to the face of the base layer. The discrepancy angle of a crystal axis in the adjacent base layer means a discrepancy angle of a crystal axis lying in a plane that is parallel to the face of the adjacent base layer, and the value of the discrepancy angle of a crystal axis in the adjacent base layer is represented by an average discrepancy angle in the adjacent base layer.

Although the material of the substrate is not particularly limited, Ni, Cr, Mn, Co, Fe, Pd, Cu, Ag, Au, or an alloy composed of at least two of such metals is preferably used as a material that can provide the biaxial orientation. The metals or the alloys may be used alone or may be laminated with other metals or alloys.

Although the material of the buffer layer is not particularly limited, the materials preferably used as a material that provides the biaxial orientation are metal oxides containing at least one metal element having a crystal structure of pyrochlore-type, fluorite-type, rock-salt-type, or perovskite-type. Specifically, the examples of such materials include rare earth oxides such as CeO2, yttria stabilized zirconia (YSZ), $BaZrO_3$ (BZO), $SrTiO_3$ (STO), $Al_2O_3$, $YAlO_3$, MgO, and Ln-M-O compounds (wherein O represents oxygen, and Ln represents at least one element of the lanthanide series, and M represents at least one element selected from the group consisting of Sr, Zr, and Ga). These oxides diminish the difference between the textured metal substrate and the superconducting layer in terms of the lattice constants and the crystal orientation. In addition, these oxides prevent the metal atoms from diffusing from the textured metal substrate to the superconducting layer. Two or more layers may be formed as the buffer layer.

When a biaxially oriented substrate that diffuses less metal atoms, for example, a biaxially oriented Ag substrate, is used, the superconducting layer may be directly formed on the biaxially oriented Ag substrate without forming the buffer layer.

In the method of producing a superconductor according to the present invention, it is possible to form a superconducting layer having a thickness of 0.75 to 3 μm by performing the film deposition at least three times on the base layer. When the thickness of the superconducting layer is less than 0.75 μm, the Jc is large but the Ic is not increased because of the small layer thickness. When the thickness of the superconducting layer exceeds 3.0 μm, the Jc is decreased as the number of times of the film deposition is increased. As a result, even when the layer thickness is increased, the Ic is not increased. From this point of view, the thickness of the superconducting layer is preferably from 0.9 to 3.0 μm.

In the method for producing the superconductor according to the present invention, the supply area of the base layer per hour (hereinafter referred to as supply area velocity of the base layer) in each film deposition can be at least 0.04 m²/h. If the supply area velocity of the base layer is less than 0.04 m2/h when the substrate corresponds to the adjacent base layer, in some cases the reaction between the substrate and the superconducting layer formed thereon increases, whereby characteristics of the superconducting layer such as Ic and Jc are deteriorated.

Referring to FIG. 1(d) in FIGS. 1(a) to 1(d), a superconductor according to the present invention is the superconductor 100 in which the superconducting layer 2 having a thickness of 0.75 μm to 3.0 μm is formed on the base layer 1 by performing film deposition at least three times, the thickness of a superconducting film made in each film deposition being 0.3 μm or less. When the thickness of the superconducting layer is less than 0.75 μm, the Jc is large but the Ic is not increased because of the small layer thickness. When the thickness of the superconducting layer exceeds 3.0 μm, the Jc is decreased as the number of times of the film deposition is increased. As a result, even when the layer thickness is increased, the Ic is not increased. From this point of view, the thickness of the superconducting layer is preferably from 0.9 to 3.0 μm.

Superconductors and methods for producing the same according to the present invention will now be more specifically described with reference to Examples.

EXAMPLES 2 TO 10 AND REFERENCE EXAMPLE 1

Referring to FIGS. 1(a) to 1(d), a Ni-based alloy tape comprising a biaxially oriented Ni alloy substrate (10 mm in width and 0.1 mm in thickness) and a biaxially oriented YSZ buffer layer (0.1 mm in thickness) formed thereon was used as a base layer 1 in FIG. 1(a) (the biaxially oriented YSZ buffer layer corresponded to the adjacent base layer 11.) As shown in FIG. 1(*b*), a superconducting layer 2 composed of $Ho_1Ba_2Cu_3O_{7-\delta}$ and having a thickness of 0.25 μm was formed by pulsed laser deposition on the biaxially oriented YSZ buffer layer that was the adjacent base layer 11 of the base layer 1. Such deposition was done in a manner such that a target composed of $Ho_1Ba_2Cu_3O_{7-\delta}$ was irradiated with a KrF excimer laser at an energy density of 3 J/cm² in an oxygen gas atmosphere having a gas pressure of 26.6 Pa (200 mTorr), into which the base layer 1 was fed at a supply area velocity of 0.05 m²/h. Furthermore, as shown in FIG. 1(*c*) and the following figure, a second and the following film deposition were performed to increase the thickness of the superconducting layer 2 under the same conditions as those in the film deposition described above.

Thus, the following 10 superconductors were prepared: a superconductor (Reference Example 1) including a superconducting layer having a thickness of 0.5 μm prepared by performing the film deposition two times; a superconductor (Example 2) including a superconducting layer having a thickness of 0.75 μm prepared by performing the film deposition three times; a superconductor (Example 3) including a superconducting layer having a thickness of 1.0 μm prepared by performing the film deposition four times; a superconductor (Example 4) including a superconducting layer having a thickness of 1.25 μm prepared by performing the film deposition five times; a superconductor (Example 5) including a superconducting layer having a thickness of 1.5 μm prepared by performing the film deposition six times; a superconductor (Example 6) including a superconducting layer having a thickness of 1.75 μm prepared by performing the film deposition seven times; a superconductor (Example 7) including a superconducting layer having a thickness of 2.0 μm prepared by performing the film deposition eight times; a superconductor (Example 8) including a superconducting layer having a thickness of 2.5 μm prepared by performing the film deposition ten times; a superconductor (Example 9) including a superconducting layer having a thickness of 3.0 μm prepared by performing the film deposition twelve times; and a superconductor (Example 10) including a superconducting layer having a thickness of 3.5 μm prepared by performing the film deposition fourteen times. The Ic of the superconductors in Examples 2 to 10 and Reference Example 1 was measured by a four-terminal method to calculate the Jc. Table I summarizes the results of the Jc and the Ic.

COMPARATIVE EXAMPLES 1 to 7

Superconductors including a superconducting layer having a large thickness were prepared by performing the film deposition once using the same base layer as that in Reference Example 1 and under the same conditions of film deposition as those in Reference Example 1, except for the supply area velocity of the base layer. The decrease in the supply area velocity of the base layer could increase the thickness of the superconducting layer. Thus, the following superconductors were prepared: a superconductor (Comparative Example 1) including a superconducting layer having a thickness of 0.25 μm; a superconductor (Comparative Example 2) including a superconducting layer having a thickness of 0.5 μm; a including a superconducting layer having a thickness of 0.75 μm; a superconductor (Comparative Example 4) including a superconducting layer having a thickness of 1.0 μm; a superconductor (Comparative Example 5) including a superconducting layer having a thickness of 1.25 μm; a superconductor (Comparative Example 6) including a superconducting layer having a thickness of 1.5 μm; and a superconductor (Comparative Example 7) including a superconducting layer having a thickness of 1.75 μm. The Jc and the Ic were measured. Table I summarizes the results. superconductor (Comparative Example 3) including a superconducting layer having a thickness of 0.75 μm; a superconductor (Comparative Example 4) including a superconducting layer having a thickness of 1.0 μm; a superconductor (Comparative Example 5) including a superconducting layer having a thickness of 1.25 μm; a superconductor (Comparative Example 6) including a superconducting layer having a thickness of 1.5 μm; and a superconductor (Comparative Example 7) including a superconducting layer having a thickness of 1.75 μm. The Jc and the Ic were measured. Table I summarizes the results.

TABLE I

|  | Comparative example 1 | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Layer thickness (μm) | 0.25 | 0.5 | 0.75 | 1.0 | 1.25 | 1.5 | 1.75 | 2.0 | 2.5 | 3.0 | 3.5 |
| The number of times of film deposition | 1 | 2 | 3 | 4 | 5 | 6 | 7 | 8 | 10 | 12 | 14 |
| Jc (MA/cm²) | 2.5 | 2.4 | 2.4 | 2.2 | 2.1 | 2.0 | 1.7 | 1.5 | 1.3 | 1.0 | 0.4 |
| Ic (A/cm in width) | 62.5 | 120 | 180 | 220 | 262.5 | 300 | 297.5 | 300 | 325 | 300 | 140 |

|  | Comparative example 1 | Comparative example 2 | Comparative example 3 | Comparative example 4 | Comparative example 5 | Comparative example 6 | Comparative example 7 |
|---|---|---|---|---|---|---|---|
| Layer thickness (μm) | 0.25 | 0.5 | 0.75 | 1.0 | 1.25 | 1.5 | 1.75 |
| The number of times of film deposition | 1 | 1 | 1 | 1 | 1 | 1 | 1 |

TABLE I-continued

| | | | | | | | |
|---|---|---|---|---|---|---|---|
| Jc (MA/cm$^2$) | 2.5 | 2.0 | 1.4 | 1.1 | 0.6 | 0.1 | 0 |
| Ic (A/cm · width) | 62.5 | 100 | 105 | 110 | 75 | 15 | 0 |

In the Examples, the film deposition was performed at least two times and the thickness of the superconducting film made in each film deposition was 0.25 μm. This method suppressed the decrease in the Jc of the superconducting layer accompanied with the increase in the thickness of the superconducting layer. Consequently, the increase in the thickness of the superconducting layer could increase the Ic. The Ic of the superconductors could be increased to about 300 A/cm-width in the five Examples (Examples 5 to 9), i.e., from the superconductor (Example 5) including the superconducting layer having a thickness of 1.5 μm prepared by performing the film deposition six times to the superconductor (Example 9) including the superconducting layer having a thickness of 3.0 μm prepared by performing the film deposition twelve times.

In contrast, in the Comparative Examples, the Jc of the superconducting layer was extremely decreased as the thickness of the superconducting layer was increased. When the thickness of the superconducting layer was 0.5 to 1.0 μm (Comparative Examples 2 to 4), the Ic was increased to no more than about 100 A/cm-width. Even when the thickness of the superconducting layer was further increased, the Ic was decreased.

Superconductors having the same layer thickness will now be compared between the Examples and Comparative Examples. In the superconductor (Reference Example 1) including a superconducting layer having a thickness of 0.5 μm prepared by performing the film deposition two times, the Ic was 120 A/cm-width. In the superconductor (Comparative Example 2) including a superconducting layer having a thickness of 0.5 μm prepared by performing the film deposition once, the Ic was 100 A/cm-width. In other words, the Ic in Reference Example 1 was larger than that in Comparative Example 2 by 20 A/cm-width. On the other hand, in the superconductor (Example 2) including a superconducting layer having a thickness of 0.75 μm prepared by performing the film deposition three times, the Ic was 180 A/cm-width. In the superconductor (Comparative Example 3) including a superconducting layer having a thickness of 0.75 μm prepared by performing the film deposition once, the Ic was 105 A/cm-width. In other words, the Ic in Example 2 was larger than that in Comparative Example 3 by no less than 75 A/cm-width. Accordingly, the Ic can significantly be increased when the superconducting layer having a thickness of at least 0.75 μm is formed by performing the film deposition at least three times with the film thickness of 0.3 μm or less in each film deposition of superconducting film.

In the case where the superconducting layer was deposited once, as shown in Comparative Example 7, when the thickness of the superconducting layer was 1.75 μm, the Jc and the Ic became zero. In contrast, in the case where the superconducting layer was deposited at least two times, the Ic was increased as the number of times of the film deposition was increased. Thus, in the superconductor (Example 5) including the superconducting layer having a thickness of 1.5 μm prepared by performing the film deposition six times, the Ic increased to 300 A/cm-width, and the Ic remained about 300 A/cm-width in the subsequent examples in which the number of times of the film deposition was increased to the case of the superconducting layer having a thickness of 3.0 μm prepared by performing the film deposition twelve times (Example 9). However, when the thickness of the superconducting layer exceeds 3.0 μm, the Jc drastically decreased, resulting in decrease of the Ic.

EXAMPLES 11 TO 14 AND COMPARATIVE EXAMPLES 8 TO 10

Superconductors were prepared as in Reference Example 1 except that: the thickness of the superconducting film in each film deposition was changed by controlling the supply area velocity of the base layer and the film deposition was performed three times in the cases where the superconducting layer was formed by performing the film deposition two times or more, that is, the thickness of the superconducting film in each film deposition was controlled to be 0.1 μm (Example 11), 0.2 μm (Example 12), 0.25 μm (Example 13), 0.3 μm (Example 14), 0.35 μm (Comparative Example 8), 0.4 μm (Comparative Example 9), or 0.5 μm (Comparative Example 10).

TABLE II

| | Example 11 | Example 12 | Example 13 | Example 14 | Comparative example 8 | Comparative example 9 | Comparative example 10 |
|---|---|---|---|---|---|---|---|
| Supply area velocity of base layer (m$^2$/h) | 0.125 | 0.0625 | 0.0500 | 0.0417 | 0.0357 | 0.0313 | 0.0250 |
| The film thickness in each film deposition (μm) | 0.1 | 0.2 | 0.25 | 0.3 | 0.35 | 0.4 | 0.5 |
| Layer thickness (Three film depositions)(μm) | 0.3 | 0.6 | 0.75 | 0.9 | 1.05 | 1.2 | 1.5 |
| Jc (MA/cm$^2$) | 2.6 | 2.5 | 2.4 | 2.2 | 1.6 | 0.8 | 0.4 |
| Ic (A/cm-width) | 78 | 150 | 180 | 198 | 168 | 96 | 60 |

As shown in Table II, when the film thickness of the superconducting film in each film deposition was increased from 0.3 μm (Example 14) to 0.35 μm (Comparative Example 8), the Jc drastically decreased from 2.2 to 1.6 MA/cm2, which resulted in decrease of the Ic from 198 to 168 A/cm-width even when the layer thickness of the superconducting layer was increased from 0.9 to 1.05 μm.

It should be understood that the embodiments and Examples disclosed herein are illustrative in all respects and are not restrictive. The scope of the present invention is defined by the appended claims rather than by the description preceding them. The equivalence of the claims and all modifications within the claims are intended to be embraced by the scope of the present invention.

INDUSTRIAL APPLICABILITY

As described above, according to the present invention, a superconducting layer is formed by performing a film deposition at least three times and the film thickness in each film deposition is 0.3 μm or less. Consequently, even when the thickness of the superconducting layer is increased, the decrease in the Jc can be suppressed and the Ic can be increased. The present invention can be widely used in order to increase the Ic of superconductors.

The invention claimed is:

1. A method of producing a superconductor wire, comprising the step of forming a superconducting layer on a base layer by performing a film deposition at least three times without substantially changing an oxygen gas pressure between the at least three times, wherein the oxygen gas pressure is below atmospheric pressure, wherein a film thickness of a superconducting film made in each film deposition is 0.3 μm or less and the superconducting layer having a layer thickness of 1.5 μm to 3 μm is formed on the base layer and wherein the base layer is composed of a substrate or composed of the substrate and a buffer layer disposed thereon, wherein in either case, a portion of the base layer adjacent to the superconducting layer has a biaxial orientation, the substrate is composed of Ni, Cr, Mn, Co, Fe, Pd, Cu, Ag, Au or an alloy composed of at least two of Ni, Cr, Mn, Co, Fe, Pd, Cu, Ag or Au and the buffer layer is composed of a metal oxide containing at least one metal element having a crystal structure a pyrochlore-type, a florite-type, a rock salt-type, or a perovskite-type.

2. The method according to claim 1, wherein a supply area velocity of the base layer in each film deposition is at least 0.04m²/h.

3. A superconductor wire comprising a superconducting layer formed by performing film deposition on a base layer at least three times without substantially changing an oxygen gas pressure between the at least three times, wherein the oxygen gas pressure is below atmospheric pressure, wherein the superconducting layer has a layer thickness in a range of 1.5 μm to 3.0 μm, a film thickness of a superconducting film made in each film deposition being 0.3 μm or less and wherein the base layer is composed of a substrate or composted of the substrate and a buffer layer disposed thereon, wherein either case, a portion of the base layer adjacent to the superconducting layer has a biaxial orientation, the substrate is composed of Ni, Cr, Mn, Co, Fe, Pd, Cu, Ag or Au or an alloy of at least two of Ni, Cr, Mn, Co, Fe, Pd, Cu, Ag or Au and the buffer layer is composed of a metal oxide containing at least one metal element having a crystal structure a pyrochlore-type, a florite-type, a rock salt-type, or a perovskite type.

4. The method according to claim 1, wherein the oxygen gas pressure is-maintained at approximately 200 m Torr during the at least three times of the film deposition and between the at least three times.

5. The method according to claim 1, wherein the film deposition is stopped between each of the at least three times of performing the film deposition.

6. The superconductor wire according to claim 3, wherein a supply area velocity of the base layer in each film deposition is at least 0.04m²/h.

7. The superconductor wire according to claim 3, wherein the oxygen gas pressure is maintained at approximately 200 m Torr during the at least three times of the film deposition and between the at least three times.

8. The superconductor wire according to claim 3, wherein the film deposition is stopped between each of the at least three times of performing the film deposition.

9. A method of producing a superconductor wire according to claim 1 wherein the critical current is at least 250 A/cm in width wherein the number of times of film deposition is in the range of 5 to 12.

10. A superconductor wire of claim 3, wherein the critical current is at least 250 A/cm in width wherein the number of times of film deposition is in the range of 5 to 12.

* * * * *